United States Patent
Ku et al.

(10) Patent No.: US 10,109,326 B2
(45) Date of Patent: Oct. 23, 2018

(54) SEMICONDUCTOR DEVICES

(71) Applicant: SK hynix Inc., Icheon (KR)

(72) Inventors: Sang Hyun Ku, Gwangju (KR); Jaeil Kim, Yongin (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/655,546

(22) Filed: Jul. 20, 2017

(65) Prior Publication Data

US 2018/0204605 A1    Jul. 19, 2018

(30) Foreign Application Priority Data

Jan. 13, 2017    (KR) .......................... 10-2017-0006398

(51) Int. Cl.
*G11C 7/10* (2006.01)
*G11C 7/12* (2006.01)
*G11C 29/12* (2006.01)

(52) U.S. Cl.
CPC .................. *G11C 7/10* (2013.01); *G11C 7/12* (2013.01); *G11C 29/1201* (2013.01)

(58) Field of Classification Search
CPC . G11C 7/1072; G11C 29/12015; G11C 29/14; G11C 7/1066; G11C 7/22; G11C 7/222; G11C 7/1045; G11C 8/12
USPC ...... 365/233.1, 189.05, 201, 230.08, 189.02, 365/194, 230.03, 230.06, 233.11, 233.14
See application file for complete search history.

(56) References Cited

U.S. PATENT DOCUMENTS

2001/0040829 A1* 11/2001 Arimoto ................ G11C 29/48
365/189.02

FOREIGN PATENT DOCUMENTS

KR    10-2015-0106524 A    9/2015

* cited by examiner

*Primary Examiner* — Thong Q Le

(57) ABSTRACT

A semiconductor device includes a latch signal generation circuit latching an external signal in synchronization with an internal clock signal to generate a latch signal, a test pulse generation circuit buffering the internal clock signal according to the latch signal to generate a test pulse signal, and a test period signal generation circuit generating a test period signal which is enabled, in response to a pulse of the test pulse signal, to execute a predetermined function.

20 Claims, 8 Drawing Sheets

FIG.3

| Valid Command Function | CA Pins | | | | | | | | | | | | | |
|---|---|---|---|---|---|---|---|---|---|---|---|---|---|---|
| | CA0 | CA1 | CA2 | CA3 | CA4 | CA5 | CA6 | CA7 | CA8 | CA9 | CA10 | CA11 | CA12 | CA13 |
| CA Vref setting during training mode | H | H | L | H | L | L | | | CA Vref setting | | | | | |
| CA ODT setting during training mode | H | H | L | H | L | H | | | CA ODT setting | | | | | |
| CS training mode entry | H | H | L | H | H | L | L | | | | | | | |
| CS training mode exit | H | H | L | H | H | L | H | | | | | | | |
| CA training mode entry | H | H | L | H | H | H | L | | | | | | | |

SEMICONDUCTOR DEVICES

CROSS-REFERENCE TO RELATED APPLICATION

The present application claims priority under 35 U.S.C 119(a) to Korean Application No. 10-2017-0006398, filed on Jan. 13, 2017, which is incorporated herein by reference in its entirety.

BACKGROUND

1. Technical Field

Embodiments of the present disclosure relate to semiconductor devices executing a training operation.

2. Related Art

Mobile systems such as portable computers, personal digital assistants (PDAs), and portable phones have been developed to reduce their weight for portability. Batteries supplying electric power to the mobile systems may affect the total weight of the mobile systems. If power consumption of semiconductor devices employed in the mobile systems is reduced, the capacity of the batteries may also be reduced, thereby decreasing the total weight of the mobile systems. Fast mobile systems are increasingly desirable with the development of multi-functional mobile systems. Data transmission speeds of semiconductor devices such as mobile memory devices (or referred to as mobile memory chips) may be important in determining operation speeds of these fast mobile systems.

Recently, a semiconductor device has been designed to simultaneously receive a command and an address through a plurality of pins. In such a case, a plurality of signals input to the semiconductor device through the plurality of pins may include information on the command and the address, and a command decoder and an address decoder may respectively decode the signals input through the plurality of pins to extract the command and the address.

In case of synchronous semiconductor devices, the command and the address may be input in synchronization with a clock signal. For example, double data rate (DDR) semiconductor devices may receive the command and the address in synchronization with a rising edge and a falling edge of the clock signal, and single data rate (SDR) semiconductor devices may receive the command and the address in synchronization with a rising edge of the clock signal.

SUMMARY

According to an embodiment, a semiconductor device includes a latch signal generation circuit, a test pulse generation circuit and a test period signal generation circuit. The latch signal generation circuit latches an external signal in synchronization with an internal clock signal to generate a latch signal. The test pulse generation circuit buffers the internal clock signal according to the latch signal to generate a test pulse signal. The test period signal generation circuit generates a test period signal which is enabled to execute a predetermined function, in synchronization with a point of time that a pulse of the test pulse signal is created. The test period signal is disabled in synchronization with a pulse of an exit pulse signal, and the pulse of the exit pulse signal is created in synchronization with a predetermined level transition point of the external signal after a predetermined period elapses from a point of time that the test period signal is enabled.

According to another embodiment, a semiconductor device includes a latch signal generation circuit, a test pulse generation circuit and a test period signal generation circuit. The latch signal generation circuit latches an external signal in synchronization with a first internal clock signal to generate a first latch signal. In addition, the latch signal generation circuit latches the external signal in synchronization with a second internal clock signal to generate a second latch signal. The test pulse generation circuit buffers the first internal clock signal according to the first latch signal to generate a first test pulse signal. In addition, the test pulse generation circuit buffers the second internal clock signal according to the second latch signal to generate a second test pulse signal. The test period signal generation circuit generates a test period signal in response to the first test pulse signal, the second test pulse signal and an exit pulse signal. A pulse of the exit pulse signal is created in synchronization with a predetermined level transition point of the external signal after a predetermined period elapses from a point of time that the test period signal is enabled.

BRIEF DESCRIPTION OF THE DRAWINGS

Various embodiments of the present disclosure will become more apparent in view of the attached drawings and accompanying detailed description, in which:

FIG. 3 is a table, which is published by the joint electron device engineering council (JEDEC), illustrating respective functions of valid commands executed according to a combination of logic values of bits included in a control signal;

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
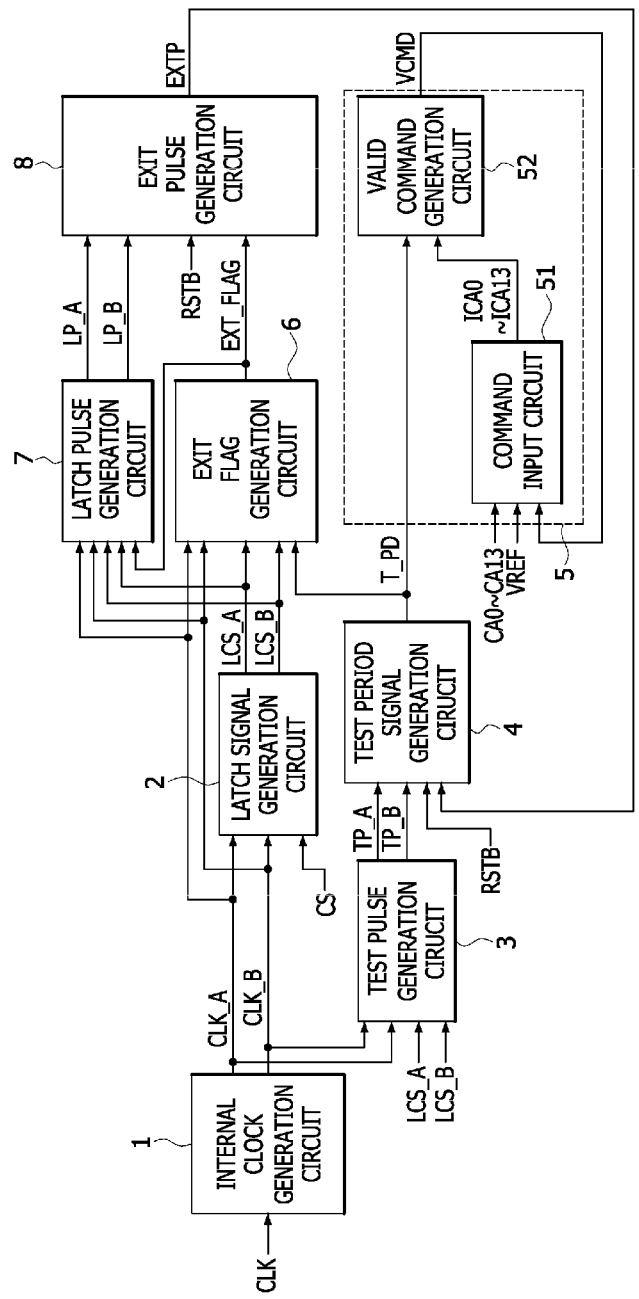
FIG. 1 is a block diagram illustrating a configuration of a semiconductor device according to an embodiment.

As illustrated in FIG. 1, a semiconductor device according to an embodiment may include an internal clock generation circuit 1, a latch signal generation circuit 2, a test pulse generation circuit 3, a test period signal generation circuit 4, a command control circuit 5, an exit flag generation circuit 6, a latch pulse generation circuit 7 and an exit pulse generation circuit 8.

The internal clock generation circuit 1 may generate a first internal clock signal CLK_A and a second internal clock signal CLK_B in response to a clock signal CLK. The internal clock generation circuit 1 may generate the first internal clock signal CLK_A having rising edges which are in synchronization with odd-numbered rising edges of the clock signal CLK. In such a case, a cycle time of the first internal clock signal CLK_A may be twice a cycle time of the clock signal CLK. In another embodiment, the rising edges of the first internal clock signal CLK_A may be in synchronization with even-numbered rising edges of the clock signal CLK. The internal clock generation circuit 1 may generate the second internal clock signal CLK_B having rising edges which are in synchronization with even-numbered rising edges of the clock signal CLK. In such a case, a cycle time of the second internal clock signal CLK_B may be twice a cycle time of the clock signal CLK. In another embodiment, the rising edges of the second internal clock signal CLK_B may be in synchronization with odd-numbered rising edges of the clock signal CLK.

The latch signal generation circuit 2 may generate a first latch signal LCS_A and a second latch signal LCS_B from a chip selection signal CS in response to the first and second internal clock signals CLK_A and CLK_B. The latch signal generation circuit 2 may latch the chip selection signal CS in synchronization with rising edges of the first internal clock signal CLK_A to generate the first latch signal LCS_A. The first latch signal LCS_A may be generated by shifting and inversely buffering the chip selection signal CS. For example, in response to a rising edge of the first internal clock signal CLK_A, the first latch signal LCS_A is set to the logic high value when the chip selection signal CS has a logic low value, and to the logic low value when the chip selection signal CS has the logic high value. The latch signal generation circuit 2 may latch the chip selection signal CS in synchronization with rising edges of the second internal clock signal CLK_B to generate the second latch signal LCS_B. The second latch signal LCS_B may be generated by shifting and inversely buffering the chip selection signal CS. For example, in response to a rising edge of the second internal clock signal CLK_B, the second latch signal LCS_B is set to the logic high value when the chip selection signal CS has a logic low value, and to the logic low value when the chip selection signal CS has the logic high value. In some embodiments, the chip selection signal CS may be input to the semiconductor device from an external device.

The test pulse generation circuit 3 may generate a first test pulse signal TP_A and a second test pulse signal TP_B from the first and second internal clock signals CLK_A and CLK_B in response to the first and second latch signals LCS_A and LCS_B. The test pulse generation circuit 3 may sample the first internal clock signal CLK_A to generate the first test pulse signal TP_A while the first latch signal LCS_A is enabled. The test pulse generation circuit 3 may buffer the first internal clock signal CLK_A to generate the first test pulse signal TP_A while the first latch signal LCS_A is enabled. The test pulse generation circuit 3 may sample the second internal clock signal CLK_B to generate the second test pulse signal TP_B while the second latch signal LCS_B is enabled. The test pulse generation circuit 3 may buffer the second internal clock signal CLK_B to generate the second test pulse signal TP_B while the second latch signal LCS_B is enabled. Each of the first and second latch signals LCS_A and LCS_B may be enabled to have one of different logic values (e.g., a logic high value and a logic low value) according to embodiments.

The test period signal generation circuit 4 may generate a test period signal T_PD in response to the first test pulse signal TP_A, the second test pulse signal TP_B, a reset signal RSTB, and an exit pulse signal EXTP. The test period signal generation circuit 4 may generate the test period signal T_PD which is enabled if a pulse of the first test pulse signal TP_A or a pulse of the second test pulse signal TP_B is generated. The test period signal generation circuit 4 may generate the test period signal T_PD which is disabled if the reset signal RSTB is enabled or a pulse of the exit pulse signal EXTP is generated. The reset signal RSTB may be enabled for a reset operation. The generation of the pulse of the first test pulse signal TP_A, the pulse of the second test pulse signal TP_B, or the pulse of the exit pulse signal EXTP may indicate that the first test pulse signal TP_A, the second test pulse signal TP_B, or the exit pulse signal EXTP is toggled. A configuration and an operation of the test period signal generation circuit 4 will be described in detail with reference to FIG. 2 below.

The command control circuit 5 may include a command input circuit 51 and a valid command generation circuit 52.

The command input circuit 51 may generate an internal control signal (or first to fourteenth internal control signals) ICA0~ICA13 from a control signal (or first to fourteenth control signals) CA0~CA13 in response to a valid command VCMD. The command input circuit 51 may buffer the control signal CA0~CA13 according to a reference voltage VREF to generate the internal control signal ICA0~ICA13 when a predetermined function is not indicated by the valid command VCMD. The command input circuit 51 may interrupt the input of the control signal CA0~CA13 when the predetermined function is indicated by the valid command VCMD. The predetermined function indicated by the valid command VCMD may include a training entry operation of the control signal CA0~CA13.

The valid command generation circuit 52 may generate the valid command VCMD for executing the predetermined function from the internal control signal ICA0~ICA13 in response to the test period signal T_PD. The predetermined function indicated by the valid command VCMD may include one or more of a function for setting a reference voltage of the control signal, a function for setting a termination resistance value of the control signal, a function for training entry of the chip selection signal, a function for training exit of the chip selection signal, and a function for training entry of the control signal. For example, the function for setting the reference voltage of the control signal may be executed by setting a level of the reference voltage VREF, which is used to buffer the control signal CA0~CA13 in the command input circuit 51 while a training operation is performed. The function for setting a termination resistance value of the control signal may be executed by setting a resistance value of a termination resistor connected to a pad (not shown) that receives the control signal CA0~CA13 while the training operation is performed. The function for training entry of the chip selection signal may be executed to enter a training operation of the chip selection signal CS, and the function for training exit of the chip selection signal may be executed to terminate the training operation of the chip selection signal CS. The function for training entry of the control signal may be executed to enter the training operation of the control signal CA0~CA13. Each of the predetermined functions that may be indicated by the valid command VCMD according to a combination of logic values of the control signal CA0~CA13 will be described in detail with reference to FIG. 3 below.

The exit flag generation circuit 6 may generate an exit flag EXT_FLAG in response to the test period signal T_PD, the first internal clock signal CLK_A, the second internal clock signal CLK_B, the first latch signal LCS_A, and the second latch signal LCS_B. The exit flag generation circuit 6 may generate the exit flag EXT_FLAG, which is enabled at a time when the first latch signal LCS_A and the second latch signal LCS_B have different logic values while the test period signal T_PD is enabled. The exit flag generation circuit 6 may generate the exit flag EXT_FLAG, which is disabled at a time when the test period signal T_PD is disabled. The exit flag EXT_FLAG which is enabled may have one of different logic values (e.g., a logic high value and a logic low value) according to embodiments.

The latch pulse generation circuit 7 may generate a first latch pulse signal LP_A and a second latch pulse signal LP_B in response to the exit flag EXT_FLAG, the first internal clock signal CLK_A, the second internal clock signal CLK_B, the first latch signal LCS_A, and the second latch signal LCS_B. The latch pulse generation circuit 7 may generate the first latch pulse signal LP_A including a pulse, which is generated by sensing a predetermined level transition time of the first latch signal LCS_A in synchronization with the first internal clock signal CLK_A, while the exit flag EXT_FLAG is enabled. The latch pulse generation circuit 7 may generate the second latch pulse signal LP_B including a pulse, which is generated by sensing a predetermined level transition time of the second latch signal LCS_B in synchronization with the second internal clock signal CLK_B, while the exit flag EXT_FLAG is enabled.

The exit pulse generation circuit 8 may generate the exit pulse signal EXTP using the exit flag EXT_FLAG, the first latch pulse signal LP_A, the second latch pulse signal LP_B, and the reset signal RSTB. The exit pulse generation circuit 8 may sense sequential logic levels of the first and second latch pulse signals LP_A and LP_B to generate the exit pulse signal EXTP that toggles, while the exit flag EXT_FLAG is enabled. A pulse width of the exit pulse signal EXTP may vary according to embodiments.

Figure 2:
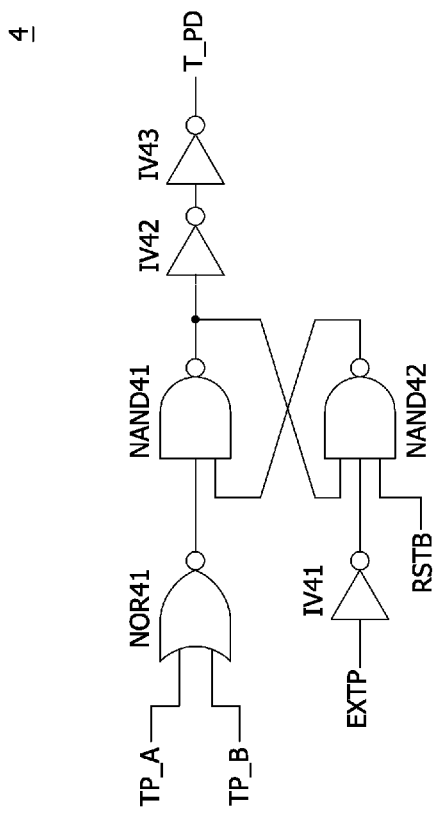
FIG. 2 is a circuit diagram illustrating an example of a test period signal generation circuit included in the semiconductor device of FIG. 1.

FIG. 2 is a circuit diagram illustrating an example of the test period signal generation circuit 4 included in the semiconductor device of FIG. 1. Referring to FIG. 2, the test period signal generation circuit 4 may include a NOR gate NOR41, NAND gates NAND41 and NAND42, and inverters IV41, IV42, and IV43. The test period signal generation circuit 4 may generate the test period signal T_PD which is initialized to have a logic low value if the reset signal RSTB is enabled to have a logic low value for an initialization operation. The test period signal generation circuit 4 may generate the test period signal T_PD which is enabled to have a logic high value if a pulse of one of the first and second test pulse signals TP_A and TP_B is generated. The test period signal generation circuit 4 may generate the test period signal T_PD which is disabled to have the logic low value if a pulse of the exit pulse signal EXTP is generated.

FIG. 3 is a table illustrating respective functions of valid commands executed according to a combination of logic values of a control signal (or first to fourteenth control signals) CA0~CA13. Referring to FIG. 3, the table is published by the joint electron device engineering council (JEDEC). The various functions of the valid command may include one or more of a function for setting a reference voltage of the control signal (or a control signal reference voltage setting function), a function for setting a termination resistance value of the control signal (or a control signal termination resistance setting function), a function for training entry of the chip selection signal (or a chip selection signal training entry function), a function for training exit of the chip selection signal (or a chip selection signal training exit function), and a function for training entry of the control signal (or a control signal training entry function). A number (e.g., 14 in FIG. 3) of the bits included in the control signal CA0~CA13 and logic values (e.g., a logic high value and a logic low value) of the bits included in the control signal CA0~CA13 may vary according to embodiments.

The control signal reference voltage setting function may be executed by an operation that sets a level of a reference voltage, which is used to buffer the control signal CA by an input buffer (not shown) during the training operation (i.e., a training mode). The first to sixth control signals CA0~CA5 having a combination of logic values, which correspond to 'H, H, L, H, L, L,' respectively, may be input to a semiconductor device (e.g., the semiconductor device of FIG. 1) to execute the control signal reference voltage setting function. The seventh to fourteenth control signals CA6~CA13 may be input to the semiconductor device to set the reference voltage VREF. The combination of logic values of the first to sixth control signals CA0~CA5 for executing the control signal reference voltage setting function may vary according to embodiments.

The control signal termination resistance setting function may be executed by an operation that sets a resistance value of a termination resistor (not shown) connected to a pad (not shown), which receives the control signal during the training operation (i.e., the training mode). The first to sixth control signals CA0~CA5 having a combination of logic values, which correspond to 'H, H, L, H, L, H,' respectively, may be input to the semiconductor device to execute the control signal termination resistance setting function. The seventh to fourteenth control signals CA6~CA13 may be input to the semiconductor device to set the resistance value of the termination resistor. The combination of logic values of the first to sixth control signals CA0~CA5 for executing the control signal termination resistance setting function may vary according to embodiments.

The chip selection signal training entry function may be executed to enter a chip selection signal training mode. The first to seventh control signal CA0~CA6 having a combination of logic values, which correspond to 'H, H, L, H, H, L, L,' respectively, may be input to the semiconductor device to execute the chip selection signal training entry function. Any logic values of the eighth to fourteenth control signals CA7~CA13 may be allowed while the chip selection signal training entry function is executed, as indicated by blank spaces in the table of FIG. 3. The combination of logic values of the first to fourteenth control signals CA0~CA13 for executing the chip selection signal training entry function may vary according to embodiments.

The chip selection signal training exit function may be executed to terminate the chip selection signal training mode. The first to seventh control signals CA0~CA6 having a combination of logic values, which correspond to 'H, H, L, H, H, L, H,' respectively, may be input to the semiconductor device to execute the chip selection signal training exit function. Any logic values of the eighth to fourteenth control signals CA7~CA13 may be allowed while the chip selection signal training exit function is executed, as indicated by blank spaces in the table of FIG. 3. The combination of logic values of the first to fourteenth control signals CA0~CA13 for executing the chip selection signal training exit function may vary according to embodiments.

The control signal training entry function may be executed to enter the control signal training mode. The first to seventh control signals CA0~CA6 having a combination of logic values, which correspond to 'H, H, L, H, H, H, L,' respectively, may be input to the semiconductor device to execute the control signal training entry function. Any logic values of the eighth to fourteenth control signals CA7~CA13 may be allowed while the control signal training entry function is executed, as indicated by blank spaces in the table of FIG. 3. The combination of logic values of the first to fourteenth control signals CA0~CA13 for executing the control signal training entry function may vary according to embodiments.

Figure 4:
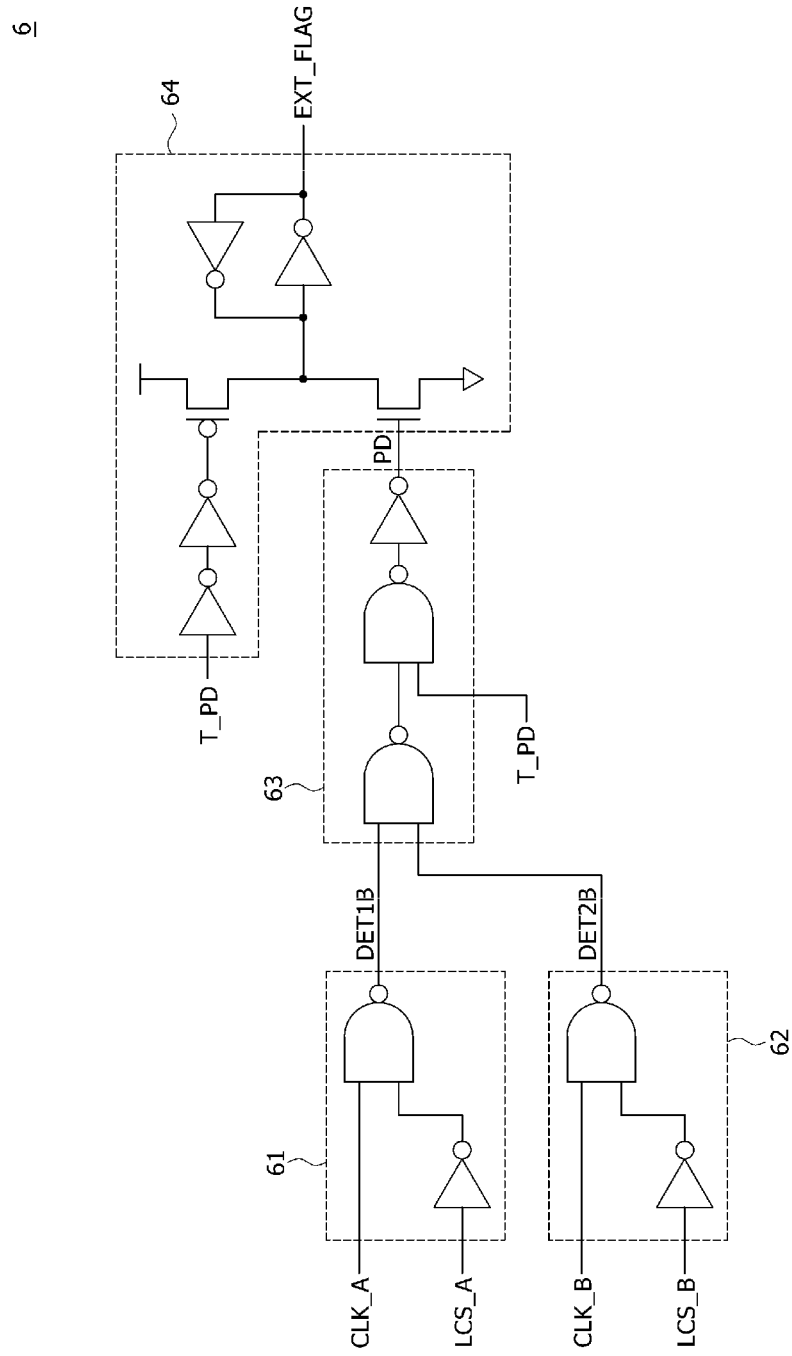
FIG. 4 is a circuit diagram illustrating an example of an exit flag generation circuit included in the semiconductor device of FIG. 1.

FIG. 4 is a circuit diagram illustrating an example of the exit flag generation circuit 6 included in the semiconductor device of FIG. 1. As illustrated in FIG. 4, the exit flag generation circuit 6 may include a first detector 61, a second detector 62, a pull-down signal generator 63, and a flag driver 64.

The first detector 61 may generate a first detection signal DET1B in response to the first internal clock signal CLK_A and the first latch signal LCS_A. The first detector 61 may be synchronized with a rising edge of the first internal clock signal CLK_A to generate the first detection signal DET1B, which is enabled to have a logic low value when the first latch signal LCS_A having a logic low value is input to the first detector 61 and the first internal clock signal CLK_A has a logic high value.

The second detector 62 may generate a second detection signal DET2B in response to the second internal clock signal CLK_B and the second latch signal LCS_B. The second detector 62 may be synchronized with a rising edge of the second internal clock signal CLK_B to generate the second detection signal DET2B, which is enabled to have a logic low value when the second latch signal LCS_B having a logic low value is input to the second detector 62 and the second internal clock signal CLK_B has a logic high value.

The pull-down signal generator 63 may generate a pull-down signal PD in response to the test period signal T_PD, the first detection signal DET1B, and the second detection signal DET2B. The pull-down signal generator 63 may generate the pull-down signal PD, which is enabled to have a logic high value when either or both of the first detection signal DET1B and the second detection signal DET2B is enabled to have a logic low value and the test period signal T_PD is enabled to have a logic high value.

The flag driver 64 may generate the exit flag (or the exit flag signal) EXT_FLAG in response to the test period signal T_PD and the pull-down signal PD. The flag driver 64 may drive the exit flag EXT_FLAG to a logic low value when the test period signal T_PD is disabled to have the logic low value. The flag driver 64 may drive the exit flag EXT_FLAG to a logic high value when the pull down signal PD is enabled to have the logic high value.

Figure 5:
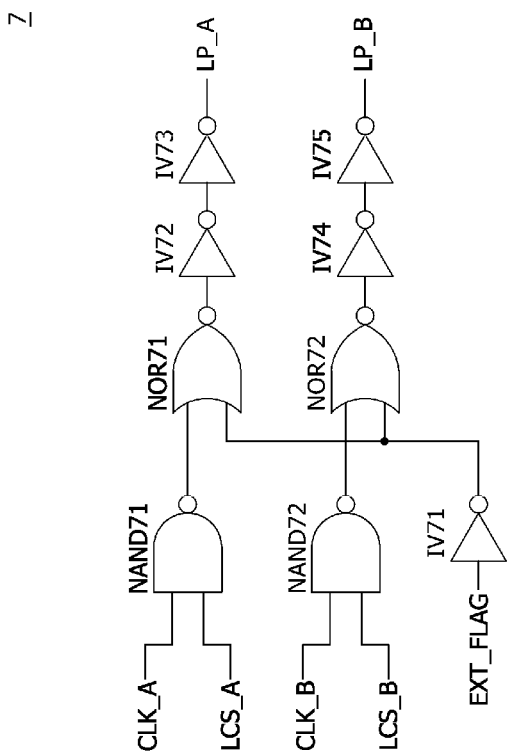
FIG. 5 is a circuit diagram illustrating an example of a latch pulse generation circuit included in the semiconductor device of FIG. 1.

FIG. 5 is a circuit diagram illustrating an example of the latch pulse generation circuit 7 included in the semiconductor device of FIG. 1. As illustrated in FIG. 5, the latch pulse generation circuit 7 may include NAND gates NAND71 and NAND72, NOR gates NOR71 and NOR72, and inverters IV71~IV75. The latch pulse generation circuit 7 may generate the first and second latch pulse signals LP_A and LP_B, which are disabled to have logic low values while the exit flag EXT_FLAG is disabled to have a logic low value. The latch pulse generation circuit 7 may be synchronized with a rising edge of the first internal clock signal CLK_A to generate the first latch pulse signal LP_A including a pulse, which is generated at a time when the first latch signal LCS_A transitions from a logic low value to a logic high value and the exit flag EXT_FLAG has a logic high value. The latch pulse generation circuit 7 may be synchronized with a rising edge of the second internal clock signal CLK_B to generate the second latch pulse signal LP_B including a pulse, which is generated at a time when the second latch signal LCS_B transitions from a logic low value to a logic high value and the exit flag EXT_FLAG has the logic high value.

Figure 6:
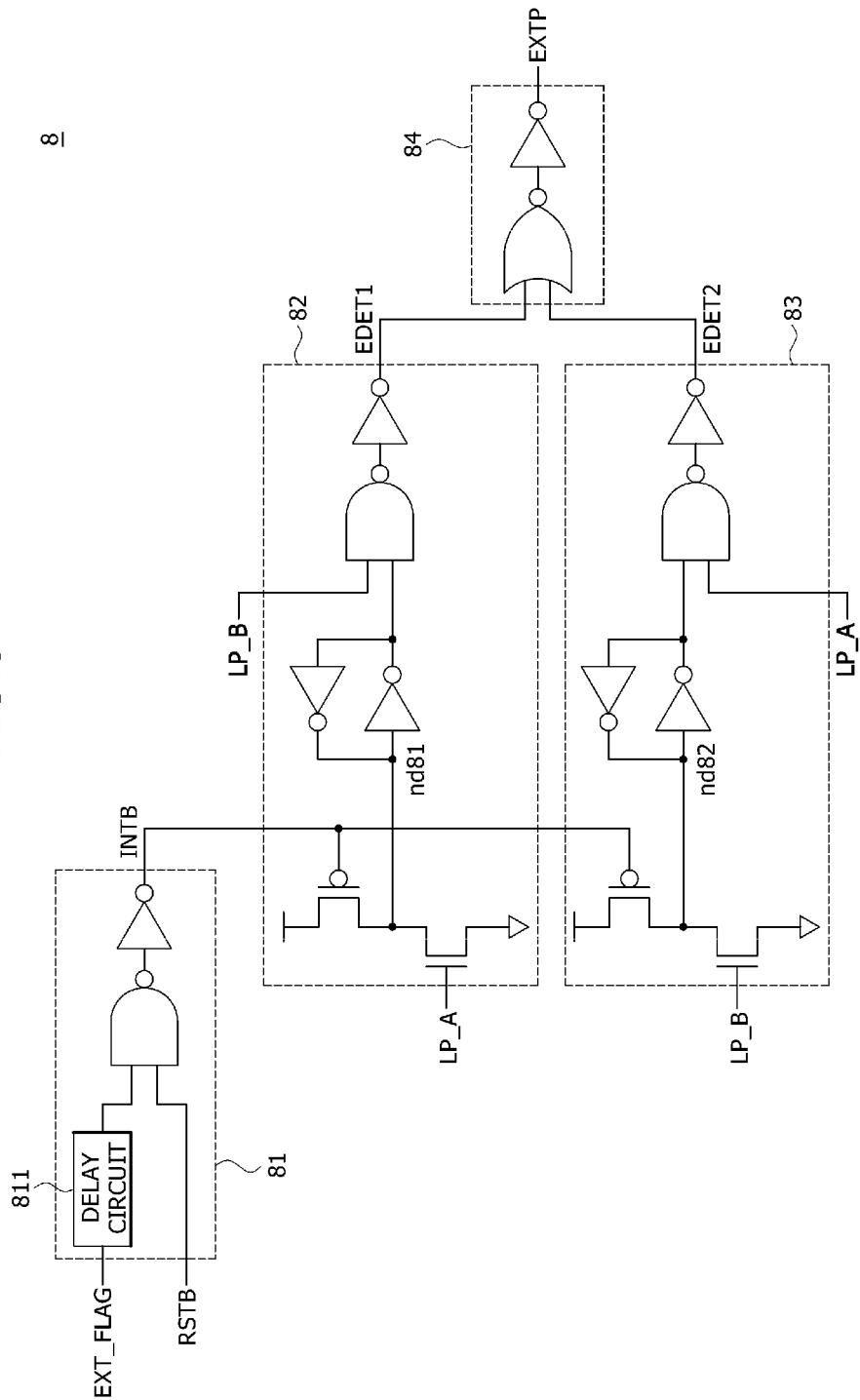
FIG. 6 is a circuit diagram illustrating an example of an exit pulse generation circuit included in the semiconductor device of FIG. 1.

FIG. 6 is a circuit diagram illustrating an example of the exit pulse generation circuit 8 included in the semiconductor device of FIG. 1. As illustrated in FIG. 6, the exit pulse generation circuit 8 may include an initial signal generator 81, a first exit detector 82, a second exit detector 83, and an exit pulse output circuit 84.

The initial signal generator 81 may include a delay circuit 811. The delay circuit 811 may delay the exit flag signal EXT_FLAG to output a delayed version of the exit flag signal EXT_FLAG. The initial signal generator 81 may generate an initial signal INTB in response to the exit flag EXT_FLAG and the reset signal RSTB. The initial signal generator 81 may generate the initial signal INTB, which is enabled to have a logic low value at a time obtained by adding a delay time of the delay circuit 811 to a time at which the exit flag EXT_FLAG is disabled to have a logic low value. The initial signal generator 81 may generate the initial signal INTB which is enabled to have a logic low value at a time when the reset signal RSTB is enabled to have a logic low value.

The first exit detector 82 may generate a first exit detection signal EDET1 in response to the initial signal INTB, the first latch pulse signal LP_A, and the second latch pulse signal LP_B. The first exit detector 82 may initialize a voltage at a node ND81 to a logic high level and may initialize the first exit detection signal EDET1 to a logic low value, if the initial signal INTB is enabled to have a logic low value. The first exit detector 82 may drive the voltage at the node ND81 to a level indicating a logic low value if the first latch pulse signal LP_A has a logic high value and may generate the first exit detection signal EDET1, which is enabled to have a logic high value at a time when the second latch pulse signal LP_B has a logic high value.

The second exit detector 83 may generate a second exit detection signal EDET2 in response to the initial signal INTB, the first latch pulse signal LP_A, and the second latch pulse signal LP_B. The second exit detector 83 may initialize a voltage at a node ND82 to a logic high level and may initialize the second exit detection signal EDET2 to a logic low value, if the initial signal INTB is enabled to have a logic low value. The second exit detector 83 may drive the voltage at the node ND82 to a level indicating a logic low level if the second latch pulse signal LP_B has a logic high value and may generate the second exit detection signal EDET2, which is enabled to have a logic high value at a time when the first latch pulse signal LP_A has a logic high value.

The exit pulse output circuit 84 may generate the exit pulse signal EXTP in response to the first exit detection signal EDET1 and the second exit detection signal EDET2. The exit pulse output circuit 84 may generate the exit pulse signal EXTP having a logic high value when either or both of the first exit detection signal EDET1 or the second exit detection signal EDET2 are enabled to have the logic high value.

Figure 7:
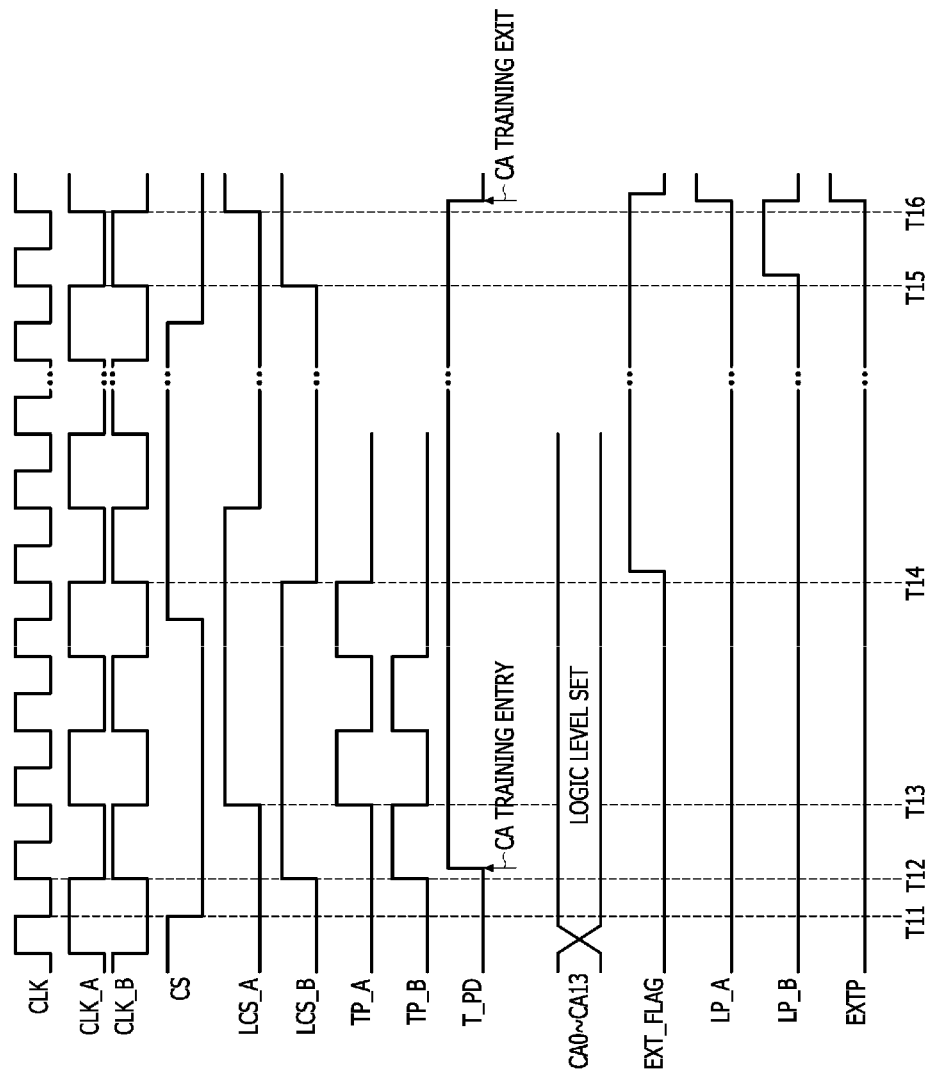
FIG. 7 is a timing diagram illustrating an operation of a semiconductor device according to an embodiment.

FIG. 7 is a timing diagram illustrating an operation of a semiconductor device suitable for use as the semiconductor device of FIG. 1 according to an embodiment. An operation of the semiconductor device will be described hereinafter with reference to FIG. 7.

The first internal clock signal CLK_A may have rising edges which are in synchronization with odd-numbered rising edges of the clock signal CLK, and the second internal clock signal CLK_B may have rising edges which are in synchronization with even-numbered rising edges of the clock signal CLK.

If the chip selection signal CS transitions from a logic high value to a logic low value at a first time T11, the second latch signal LCS_B may be enabled to have a logic high value in synchronization with a rising edge of the second internal clock signal CLK_B at a second time T12. The first latch signal LCS_A may be enabled to have a logic high value in synchronization with a rising edge of the first internal clock signal CLK_A at a third time T13. The second test pulse signal TP_B may be toggled at the second time T12 corresponding to the rising edge of the second internal clock signal CLK_B when the second latch signal LCS_B has a logic high value. The first test pulse signal TP_A may be toggled at the third time T13 corresponding to the rising edge of the first internal clock signal CLK_A when the first latch signal LCS_A has a logic high value.

At the second time T12, the test period signal T_PD may be enabled to have a logic high value in response to the second test pulse signal TP_B having a logic high value. The control signal CA0~CA13 having a predetermined logic level combination may be input to a semiconductor device (e.g., the semiconductor device of FIG. 1) to execute the control signal training entry function or the like while the test period signal T_PD is enabled to have the logic high value.

At a fourth time T14, the second latch signal LCS_B generated in synchronization with the second internal clock signal CLK_B may transition from a logic high value into a logic low value, and the first latch signal LCS_A generated in synchronization with the first internal clock signal CLK_A may maintain a logic high value. Because the logic value of the second latch signal LCS_B has the logic low value and the test period signal T_PD has a logic high value at the fourth time T14, the exit flag EXT_FLAG may be enabled to have a logic high value.

The second latch signal LCS_B transitions from the logic low value to the logic high value at a fifth time T15 corresponding to a rising edge of the second internal clock signal CLK_B. Because the exit flag signal EXT_FLAG has the logic high value, a pulse of the second latch pulse signal LP_B is generated. The first latch signal LCS_A transitions from the logic low value to the logic high value at a sixth time T16 corresponding to a rising edge of the first internal clock signal CLK_A. Because the exit flag signal EXT_FLAG has the logic high value, a pulse of the first latch pulse signal LP_A is generated. When the exit flag EXT_FLAG is high and the first latch pulse signal LP_A has a logic high value after the second latch pulse signal LP_B has had a logic high value, the exit pulse signal EXTP may be toggled. As a result, the exit pulse signal EXTP may include a pulse which is generated at the sixth time T16 when the pulse of the second latch pulse signal LP_B and the pulse of the first latch pulse signal LP_A which have been sequentially sensed.

In response to the exit pulse signal EXTP having a logic high value, the test period signal T_PD may be disabled to have a logic low value by a pulse of the exit pulse signal EXTP, thereby executing a control signal training exit function.

As described above, a semiconductor device (e.g., the semiconductor device of FIG. 1) according to an embodiment may generate an exit flag (e.g., the exit flag signal EXT_FLAG), which is enabled after a predetermined period (e.g., a time interval between the second and fourth times T12 and T14 of FIG. 7) elapses from a time (e.g., the second time T12 of FIG. 7) at which the semiconductor device enters a training mode in response to a control signal, The semiconductor device may exit the training mode according to an exit pulse signal including a pulse which is generated in synchronization with a chip selection signal while the exit flag is enabled. It is possible to stably secure a section in which the training mode is performed.

Figure 8:
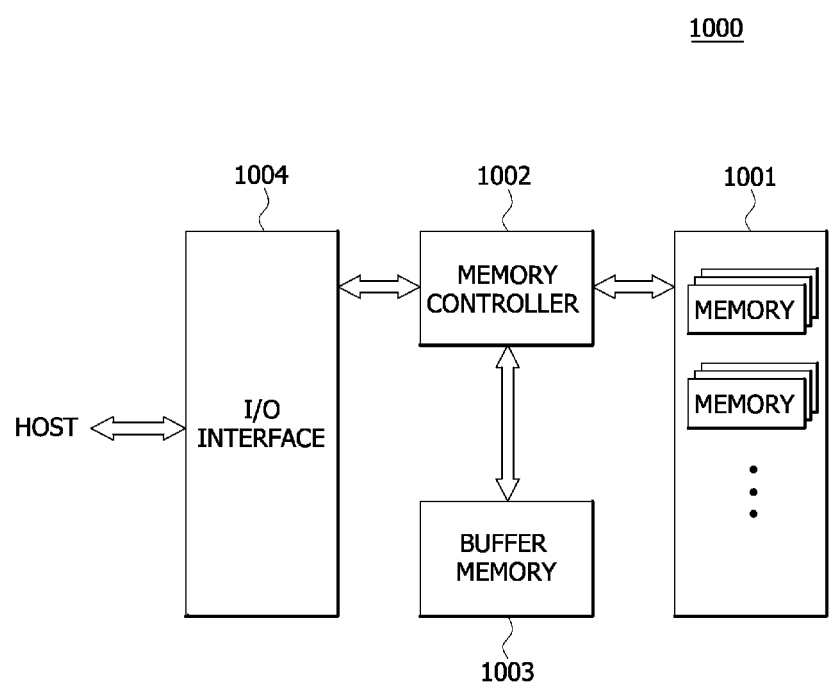
FIG. 8 is a block diagram illustrating an electronic system employing the semiconductor device shown in FIG. 1 according to an embodiment.

The semiconductor device described with reference to FIGS. 1 to 7 may be applied to an electronic system that includes a memory system, a graphic system, a computing system, a mobile system, or the like. For example, as illustrated in FIG. 8, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated by the memory controller 1002. The data storage circuit 1001 may include the semiconductor device illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 8 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a latch signal generation circuit configured to latch an external signal in synchronization with an internal clock signal to generate a latch signal;
a test pulse generation circuit configured to buffer the internal clock signal according to the latch signal to generate a test pulse signal; and
a test period signal generation circuit configured to generate a test period signal which is enabled, in response to a pulse of the test pulse signal, to execute a predetermined function,
wherein the test period signal is disabled in response to a pulse of an exit pulse signal, and the pulse of the exit pulse signal is generated in synchronization with the external signal after a predetermined period elapses from a time at which the test period signal is enabled.

2. The semiconductor device of claim 1, wherein the external signal is a chip selection signal.

3. The semiconductor device of claim 1, further comprising an internal clock generation circuit configured to receive a clock signal output from an external device and to generate the internal clock signal in synchronization with a predetermined edge of the clock signal,
wherein a cycle time of the internal clock signal is twice as long as a cycle time of the clock signal.

4. The semiconductor device of claim 1, wherein the latch signal generation circuit shifts and buffers the external signal in synchronization with the internal clock signal to generate the latch signal.

5. The semiconductor device of claim 1, wherein the test pulse generation circuit generates the test pulse signal by buffering the internal clock signal when the latch signal is enabled.

6. The semiconductor device of claim 1,
wherein the test period signal is enabled in response to the test pulse signal having a logic high value, and
wherein the test period signal is disabled in response to the exit pulse signal having a logic high value.

7. The semiconductor device of claim 1, wherein the predetermined function includes one or more of a control signal reference voltage setting function, a control signal termination resistance setting function, a chip selection signal training entry function, a chip selection signal training exit function, and a control signal training entry function.

8. The semiconductor device of claim 1, further comprising an exit flag generation circuit configured to generate an exit flag which is enabled in response to the latch signal transitioning from a first logic value to a second logic value when the test period signal is enabled.

9. The semiconductor device of claim 8, further comprising an exit pulse generation circuit configured to generate the exit pulse signal according to a latch pulse signal which is generated in synchronization with a predetermined edge of the latch signal when the exit flag is enabled.

10. A semiconductor device comprising:
a latch signal generation circuit configured to latch an external signal in synchronization with a first internal clock signal to generate a first latch signal and configured to latch the external signal in synchronization with a second internal clock signal to generate a second latch signal;
a test pulse generation circuit configured to buffer the first internal clock signal according to the first latch signal to generate a first test pulse signal and configured to buffer the second internal clock signal according to the second latch signal to generate a second test pulse signal; and
a test period signal generation circuit configured to generate a test period signal in response to the first test pulse signal, the second test pulse signal, and an exit pulse signal,
wherein a pulse of the exit pulse signal is generated in synchronization with the external signal after a predetermined period elapses from a time at which the test period signal is enabled.

11. The semiconductor device of claim 10, further comprising an internal clock generation circuit configured to receive a clock signal,
wherein the internal clock generation circuit generates the first internal clock signal in synchronization with odd-numbered edges of the clock signal, and
wherein the internal clock generation circuit generates the second internal clock signal in synchronization with even-numbered edges of the clock signal.

12. The semiconductor device of claim 10,
wherein the latch signal generation circuit generates the first latch signal by shifting and buffering the external signal in synchronization with the first internal clock signal, and
wherein the latch signal generation circuit generates the second latch signal by shifting and buffering the external signal in synchronization with the second internal clock signal.

13. The semiconductor device of claim 10,
wherein the test pulse generation circuit generates the first test pulse signal by buffering the first internal clock signal when the first latch signal is enabled; and
wherein the test pulse generation circuit generates the second test pulse signal by buffering the second internal clock signal when the second latch signal is enabled.

14. The semiconductor device of claim 10,
wherein the test period signal is enabled at a time when the first test pulse signal or the second test pulse signal has a logic high value; and
wherein the test period signal is disabled in synchronization with a time when the exit pulse signal has a logic high value.

15. The semiconductor device of claim 10, further comprising an exit flag generation circuit configured to generate an exit flag which is enabled at a time when the first latch signal and the second latch signal respectively have first and second logic values when the test period signal is enabled, the first logic value being different from the second logic value.

16. The semiconductor device of claim 15, wherein the exit flag generation circuit includes:
 a first detector configured to sense the first logic value of the first latch signal in synchronization with the first internal clock signal to generate a first detection signal;
 a second detector configured to sense the second logic value of the second latch signal in synchronization with the second internal clock signal to generate a second detection signal;
 a pull-down signal generator configured to generate a pull-down signal in response to the test period signal, the first detection signal, and the second detection signal; and
 a flag driver configured to generate the exit flag in response to the test period signal and the pull-down signal.

17. The semiconductor device of claim 10, further comprising a latch pulse generation circuit configured to generate a first latch pulse signal including a pulse which is generated in synchronization with a predetermined edge of the first latch signal when an exit flag is enabled and configured to generate a second latch pulse signal including a pulse which is generated in synchronization with a predetermined edge of the second latch signal when the exit flag is enabled.

18. The semiconductor device of claim 17, further comprising an exit pulse generation circuit configured to generate the exit pulse signal including a pulse which is generated in response to the first latch pulse signal and the second latch pulse signal.

19. The semiconductor device of claim 18, wherein the exit pulse generation circuit includes:
 a first exit detector configured to generate a first exit detection signal which is enabled if a pulse of the first latch pulse signal and a pulse of the second latch pulse signal are sequentially generated;
 a second exit detector configured to generate a second exit detection signal which is enabled if the pulse of the second latch pulse signal and the pulse of the first latch pulse signal are sequentially generated; and
 an exit pulse output circuit configured to output the exit pulse signal in response to the first exit detection signal and the second exit detection signal.

20. The semiconductor device of claim 19, wherein the exit pulse generation circuit further includes an initial signal generator configured to generate an initial signal that initializes the exit pulse signal in response to the exit flag and a reset signal.

* * * * *